United States Patent
Brinker et al.

(10) Patent No.: US 6,387,453 B1
(45) Date of Patent: May 14, 2002

(54) METHOD FOR MAKING SURFACTANT-TEMPLATED THIN FILMS

(75) Inventors: C. Jeffrey Brinker, Albuquerque, NM (US); Yunfeng Lu, San Jose, CA (US); Hongyou Fan, Albuquerque, NM (US)

(73) Assignee: Sandia Corporation, Albuquerque, NM (US)

( * ) Notice: Subject to any disclaimer, the term of this patent is extended or adjusted under 35 U.S.C. 154(b) by 0 days.

(21) Appl. No.: 09/517,873

(22) Filed: Mar. 2, 2000

(51) Int. Cl.[7] ............................. B05D 3/02; B05D 3/10; B05D 1/02; B05D 3/12; B05D 1/18

(52) U.S. Cl. ................... 427/387; 427/240; 427/245; 427/346; 427/376.2; 427/377; 427/397.7; 427/421; 427/430.1

(58) Field of Search ................... 427/245, 240, 427/346, 377, 376.2, 397.7, 387, 421, 430.1

(56) References Cited

U.S. PATENT DOCUMENTS 5,595,715 A * 1/1997 Roth .................... 423/328.1
5,858,457 A * 1/1999 Brinker et al. ............ 427/162
6,177,534 B1 * 1/2001 Antonucci et al. .......... 528/26

OTHER PUBLICATIONS

Fowler et al., "Synthesis and Characterization of Ordered Organo–Silica–Surfactant Mesophases with Functionalized MCM–41–Type Architecture", CHEM. COMMUN., 1997, p. 1769–1770.*

Sellinger et al., "Continuous Self–Assembly of Organic–Inorganic Nanocomposite Coatings that Mimic Nacre", NATURE, vol. 394, Jul. 1998, pp. 256–260.*

Burkett, S., Sims, S., and Mann, S., "Synthesis of Hybrid Inorganic–organic Mesoporous Silica by Co–condensation of Siloxane and Organosiloxane Precursors," Chem. Commun., 1996, 11, 1367–1368.

Fowler, C., Burkett, S., and Mann, S., "Synthesis and Characterization of Ordered Organo–silica–surfactant Mesophases with Functionalized MCM–41–type Architecture," Chem. Commun., 1997, 1769–1770.

Lim, M., Blanford, C., and Stein, A., "Synthesis and Characterization of a Reactive Vinyl–functionalized MCM–41: Probing the Internal Pore Structure by a Bromination Reaction," J. Am. Chem. Soc., 1997, 119, 4090–4091.

Feng, X., Fryxell, G., Wang, L., Kim, A. Liu, J., and Kemner, K., "Functionalized Monolayers on Ordered Mesoporous Supports," Science, 1997, 276, 923–926.

Sellinger, A., Weiss, P., Nguyen, A., Lu, Y., Assink, R., Gong, W., and Brinker, C., "Continuous Self–assembly of Organic–inorganic Nanocomposite Coatings that Mimic Nacre," Nature, 1998, 394, 256–260.

Moroi, Y., Motomura, K., and Matuura, R., "The Critical Micelle Concentration of Sodium Dodecyl Sulfate–Bivalent Metal Dodecyl Sulfate Mixtures in Aqueous Solutions," 1974, 46, 1, 111–117, Journal of Colloid and Interface Science.

* cited by examiner

Primary Examiner—Michael Barr
(74) Attorney, Agent, or Firm—Elmer A. Klavetter

(57) ABSTRACT

An evaporation-induced self-assembly method to prepare a porous, surfactant-templated, thin film by mixing a silica sol, a solvent, a surfactant, and an interstitial compound, evaporating a portion of the solvent to form a liquid, crystalline thin film mesophase material, and then removal of the surfactant template. Coating onto a substrate produces a thin film with the interstitial compound either covalently bonded to the internal surfaces of the ordered or disordered mesostructure framework or physically entrapped within the ordered or disordered mesostructured framework. Particles can be formed by aerosol processing or spray drying rather than coating onto a substrate. The selection of the interstitial compound provides a means for developing thin films for applications including membranes, sensors, low dielectric constant films, photonic materials and optical hosts.

21 Claims, 7 Drawing Sheets a) ordered b) disordered

METHOD FOR MAKING SURFACTANT-TEMPLATED THIN FILMS

This invention was made with Government support under Contract No. DE-AC04-94AL85000 awarded by the Department of Energy. The Government has certain rights in the invention.

BACKGROUND OF THE INVENTION

The invention relates to a method for producing surfactant-templated thin films and more particularly, to an evaporation-induced method for producing surfactant-templated hybrid (inorganic/organic) and composite thin films.

Hybrid organic/inorganic films with controlled pore structure and surface chemistry are of interest for a wide range of applications including membranes, sensors, low dielectric constant (low k) films, photonic materials, and optical hosts. Surfactant templating is a rather recent approach toward achieving pore size control of inorganic frameworks, and so-called hybrid sol-gel chemistry provides a convenient route to derivatize the pore surfaces with covalently-bonded organic ligands. Burkett et al. (Burkett, S., Sims, S., and Mann, S., Chemical Communications, 1996, 11, 1367–1368), Fowler et al. (Fowler, C., Burkett, S., and Mann, S., Chemical Communications, 1997, 1769–1770), and Lim et al. (Lim, M., Blanford, C., and Stein, A., J. Amer. Chem. Soc., 1997, 119, 4090–4091) recently combined these approaches to form hybrid inorganic/organic mesoporous silica. Their synthesis procedures involved reacting tetraalkoxysilanes ($Si(OR)_4$, where R=ethyl or methyl) and an organoalkoxysilane ($R'Si(OR)_3$, where R' is a non-hydrolyzable organic ligand) with water under basic pH conditions in the presence of surfactant (cetyltrimethylammonium bromide) with initial surfactant concentration $c_o$>cmc. These procedures result in the precipitation of powder. Various acid/solvent extraction procedures were used to remove the surfactant, resulting in organically-modified mesoporous powders with 1-dimensional, hexagonal architectures. The organic ligands in the mesoporous products included vinyl, phenyl, n-octyl, 3-sulfanylpropyl, aminopropyl, 2,3-epoxypropoxy, and imidazole. In all of these examples, the hybrid mesoporous silica was in the form of powder, precluding its use in such promising applications as membranes, low k films, and optically-based sensors that generally require transparent, defect-free, supported thin films.

A second general approach to preparing hybrid-mesophases is to prepare a stable, mesoporous silica product and then to react the pore surfaces with various organic groups using standard silane coupling chemistry. For example, Feng et al. (Feng, X., Fryxell, G. Wang, L. Kim. A., Liu, J. and Kemner, K., Science, 1997, 276, 923–926) prepared mesoporous silica products using cetyltrimethylammonium chloride as the surfactant template. After calcination, the mesoporous silica was reacted with trimethoxymercaptopropylsilane. The powder was used to remove mercury and other heavy metals from contaminated solutions. Mesoporous silicas have also been organically-derivatized via vapor phase techniques. These powders suffer the same limitations as described above.

Sellinger et al. (Sellinger, A., Weiss, P., Nguyen, A., Lu, Y., Assink, R., Gong, W., and Brinker, C., Nature, 1998, 394, 256–260; incorporated herein by reference) describe a solvent evaporation technique to form ordered structures through a liquid phase process, but with little or no porosity. Brinker et al. (U.S. Pat. No. 5,858,457, issued on Jan. 12, 1999) describe a solvent-evaporation method to form mesostructured films using metal oxides but the method does not provide for the preparation of hybrid inorganic/organic and composite thin films. Brinker et al. also do not provide for covalently bonding ligands to the porous film structure or for entrapping molecules within the pores. Useful would be a liquid-phase method to form porous thin films with inorganic or organic functional groups using a solvent evaporation technique with essentially uni-modal pore size distributions and high surface areas.

SUMMARY OF THE INVENTION

According to the present invention, an evaporation-induced self-assembly method is provided to prepare a porous, hybrid surfactant-templated, thin film by mixing a silica sol precursor, a solvent, a surfactant, and an interstitial compound to first form a silica sol, evaporating a portion of the solvent to form a liquid crystalline thin film mesophase and heating the liquid crystalline mesophase to remove surfactant. Because the surfactant is at a concentration less than the critical micelle concentration, evaporation of a portion of the solvent, such as can occur during coating onto a substrate or during aerosol processing or spray drying, forms a liquid-phase crystalline mesophase material. Coating onto a substrate by spin-coating, dip-coating and spray-coating forms a thin film wherein the thin film can be either ordered or disordered. Processing by aerosol processing or spray drying permits formation of structured particles.

The interstitial compound can be inorganic or organic, and more particularly is an organoalkoxysilanes, proteins, dyes, or metal-containing compounds. These interstitial molecules are covalently bonded or physically entrapped within the mesoporous structure. The formed thin film has pores of diameter of approximately less than 200 Å with a surface area greater than approximately 100 $cm^2/cm^2$ of deposited film.

DETAILED DESCRIPTION OF THE INVENTION

Figure 1:
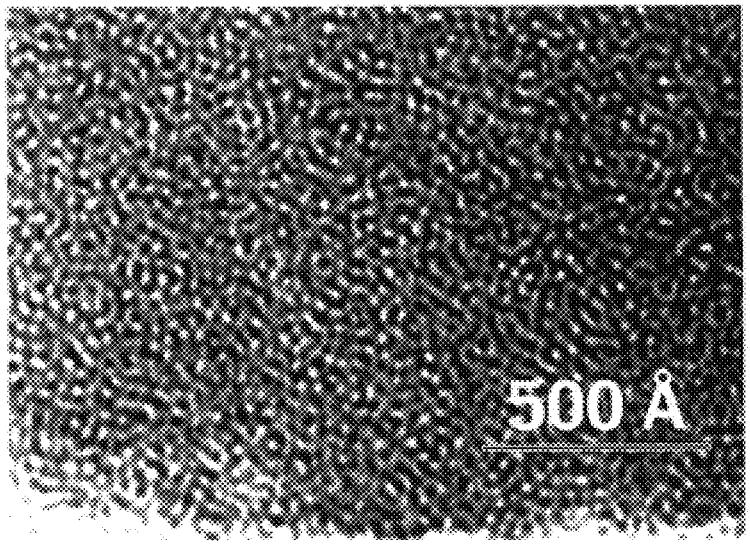
FIG. 1 shows transmission electron microscopy (TEM) images of disordered and ordered thin films.
Figure 1:
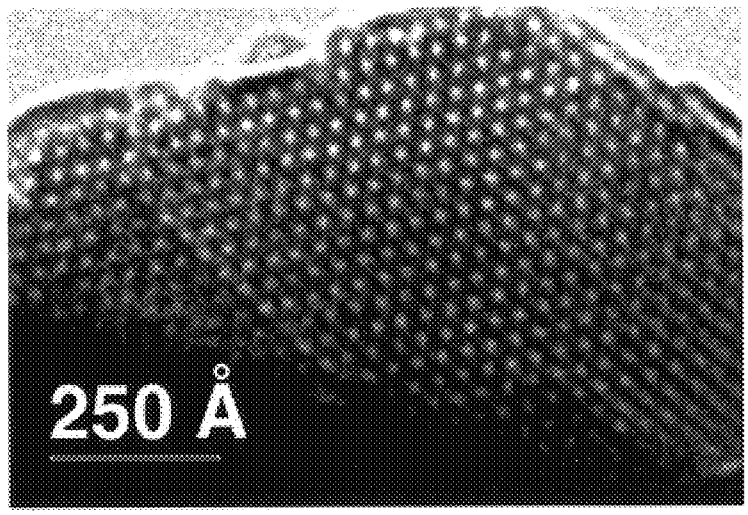

The present invention provides a method to prepare hybrid organic/inorganic, metal/inorganic, and bioactive composite porous, mesophase structures and subsequent thin films with controlled pore structure and surface chemistry. A hybrid mesoporous thin film incorporates inorganic, organic or composite molecules into the mesophase structure of the formed material. These films are of interest for a wide range of applications including uses in membranes, sensors, low dielectric constant (low k) films, photonic materials, optical hosts and in biomedical applications such as drug delivery systems and in tissue engineering. In contrast to prior methods that formed hybrid inorganic/organic mesoporous silica, wherein the silica was in the form of powder, the present invention is a method for forming a liquid material that can be used to form thin films by such standard methods as dip-coating, spray-coating, or spin-coating and to form particles by an aerosol method or spray-drying. The present invention provides a method to prepare porous hybrid organic/inorganic, metal/inorganic, and bioactive composite porous thin films and particles with surface areas greater than approximately 100 cm$^2$/cm$^2$ (film) or greater 500 m$^2$/g (powder) and narrow pore size distributions, generally with the pore diameters in the approximate range of 10 to 200 Å, [or in the case of polymers, hierarchical films containing micro-emulsion and liquid crystalline-templated pores after calcination].

According to the present invention, in the liquid phase, a precursor sol is mixed with a solvent, water and a surfactant, wherein importantly the initial surfactant concentration, $c_o$, is less than the critical micelle concentration, cmc. Because the surfactant concentration is less than the critical micelle concentration, subsequent solvent evaporation during film formation or particle formation induces micellization and continuous self-assembly into hybrid surfactant-silica-interstitial compound mesophases. Added to the initial mixture is an inorganic or organic compound, which is hereafter referred to as an interstitial compound, that is organized during the micellization into the mesophase structure by either covalent bonding to the framework or physical entrapment within the self-assembled mesostructured framework. Interestingly, these interstitial molecules can be larger than the characteristic sizes of the self-assembled mesostructure material, with the formed mesostructure conforming around these molecules to form an essentially defect-free mesophase structure while still retaining (after surfactant removal) a narrow pore size distribution and relatively high porosity and surface area.

The precursor sol is generally prepared from tetra-alkoxysilanes, an alkoxysilane, such as tetraethylorthosilicate or tetramethylorthosilicate, or a metal alkoxide, including titanium butoxide, titanium iso-propoxide, zirconium n-butoxide, aluminum iso-propoxide, aluminum iso-propoxide, and mixtures thereof.

Interstitial compounds include, but are not limited to, organoalkoxysilanes, proteins, dyes, and metal-containing compounds. The presence of these inorganic and organic compounds in the hybrid mesophase structure of the present invention allow these materials to be used in sensor applications, as low dielectric constant films, as photonic materials and as optical hosts.

In one embodiment, a homogeneous solution of an alkoxysilane (Si(OR)$_4$, a polar solvent, water, an organoalkoxysilane as the interstitial compound and a surfactant is prepared, wherein importantly the initial surfactant concentration, c, is less than the critical micelle concentration, cmc. Any organoalkoxysilane compound can be used but certain compounds are useful for their specific functionality. For example, organoalkoxysilanes with fluorinated groups, such as tridecafluoro-1,1,2,2,-tetrahydrooctyltriethoxysilane (TFTS), make the film hydrophobic and compounds with mercapto-terminated groups, such as mercaptopropyltrimethoxylsilane, can absorb heavy metals.

The surfactant can be anionic, cationic, nonionic, or a block copolymer. Anionic surfactants that can be used include, but are not limited to, sulfates, sulfonates, phosphates, and carboxylic acids. Cationic surfactants that can be used include, but are not limited to, alkylammonium salts, gemini surfactants, cetylethylpiperidinium salts, and dialkyldimethylammonium. Nonionic surfactants that can be used, with the hydrophilic group not charged, include, but are not limited to, primary amines, poly(oxyethylene) oxides, octaethylene glycol monodecyl ether and octaethylene glycol monohexadecyl ether. The polar organic/water solvent can be any general polar organic solvent soluble in water, such as an alcohol/water solvent, a formamide/water solvent or a tetrahydrofuran/water solvent.

Because the surfactant concentration is less than the critical micelle concentration, subsequent solvent evaporation induces micellization and continuous self-assembly into hybrid silica-surfactant mesophases. When the solvent evaporation is accomplished by spin-coating, spray-coating or dip-coating, a porous thin film is formed on a substrate which yields, after surfactant removal, a thin film with a narrow pore size distribution, typically from approximately 10 Å to approximately 200 Å, and a relatively high surface area, typically greater than 100 cm$^2$/cm$^2$ (film). and frequently greater than 500 cm$^2$/cm$^2$(film). Particles can be formed by using aerosol processing or spray drying. Using organoalkoxysilane molecules, the organic ligands are covalently bonded to the framework and positioned on the pore surfaces in the present invention to achieve desired functionality. After the self-assembly process, the surfactant templates can be removed while preserving the organo-silicon bonds. This can be accomplished by using a low-temperature heat treatment or washing procedure. Because solvent extraction techniques may collapse the mesoporous network, surfactant molecules can be removed by a low temperature pyrolysis procedure wherein the films are heated in an inert atmosphere to a temperature sufficient to decompose the surfactant molecules (for example, 250° C.) without degrading any covalently-bound organic ligands. This heat treatment also promotes further condensation of the silica framework, helping to stabilize the mesoporous network. Alternatively, the hybrid silica-surfactant mesophase can be treated with a catalyst to promote the framework polymerization prior to surfactant removal.

In one preparation to form thin films, a silica sol was prepared from tetraethylorthosilicate (TEOS), a polar organic solvent, water and an acid with addition of an organoalkoxysilane, for example, tridecafluoro-1,1,2,2,-tetrahydrooctyltriethoxysilane (TFTS), and a surfactant, such as cetyltrimethylammonium bromide (CTAB). The polar organic solvent can be any solvent that solubilizes the other reactants, particularly such solvents as alcohols, and more particularly, methanol, ethanol, propanol, butanol, tetrahydrofuran, and formamide or mixtures thereof. In a typical preparation, an initial silica sol (A2**) was prepared by refluxing tetraethylorthosilicate (TEOS), ethanol, water and an acid, such as HCl, with addition of TFTS and CTAB. A thin film was prepared from this solution by spray-coating, dip-coating, or spin-coating on a substrate. During the coating procedure, evaporation of the solvent causes organization into the mesophase structure. Subsequently, the films were pyrolyzed in an oxygen on inert environment at elevated temperature to form an ordered mesoporous structure. These films were shown to be useful in sensor applications as films of thickness less than 1 micron had pore sizes between approximately 10 Å and approximately 100 Å, with a surface area greater than 500 cm$^2$/cm$^2$ (film).

Figure 2:
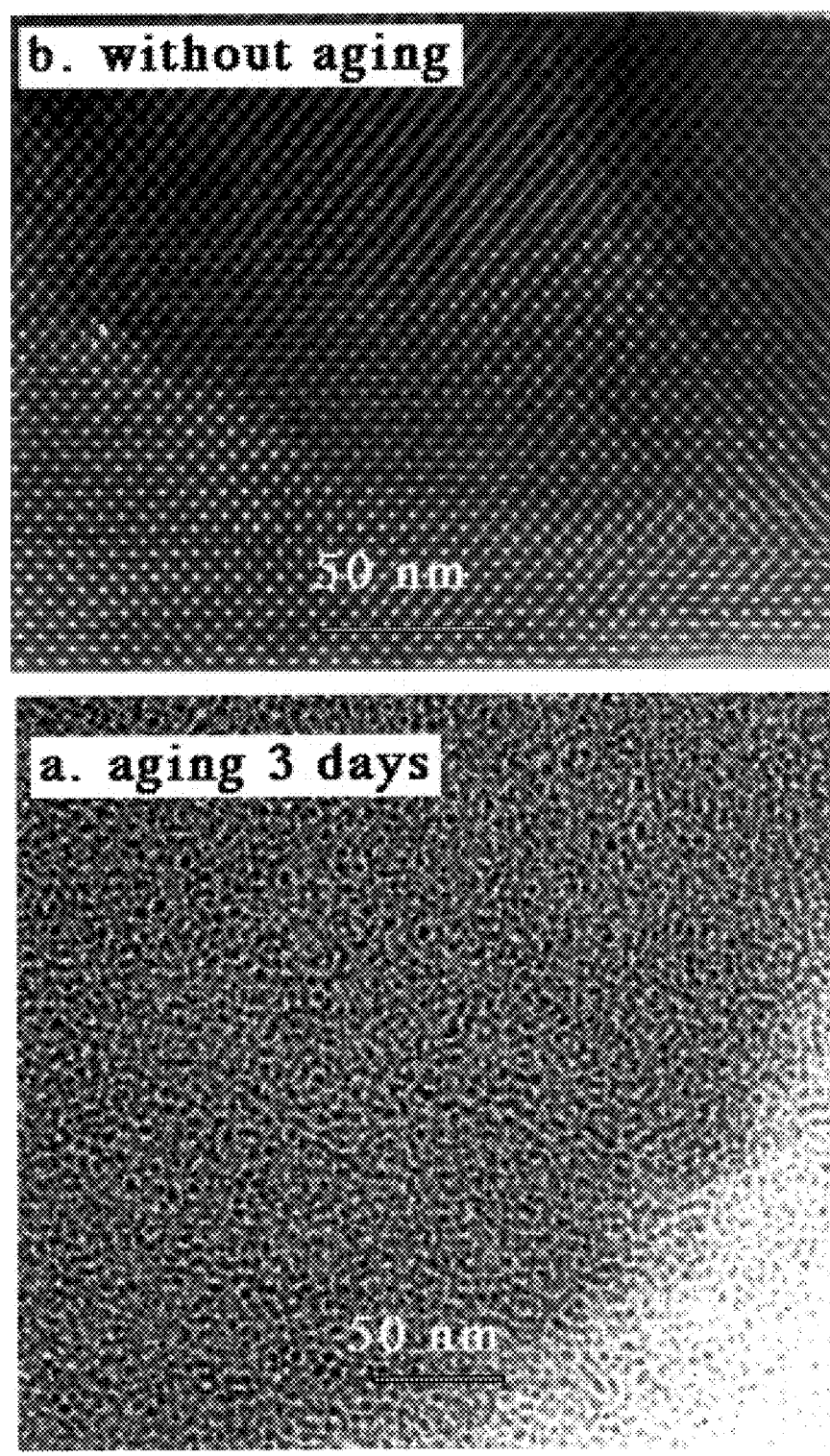
FIG. 2 shows TEM images of disordered and ordered thin films.
Figure 3:
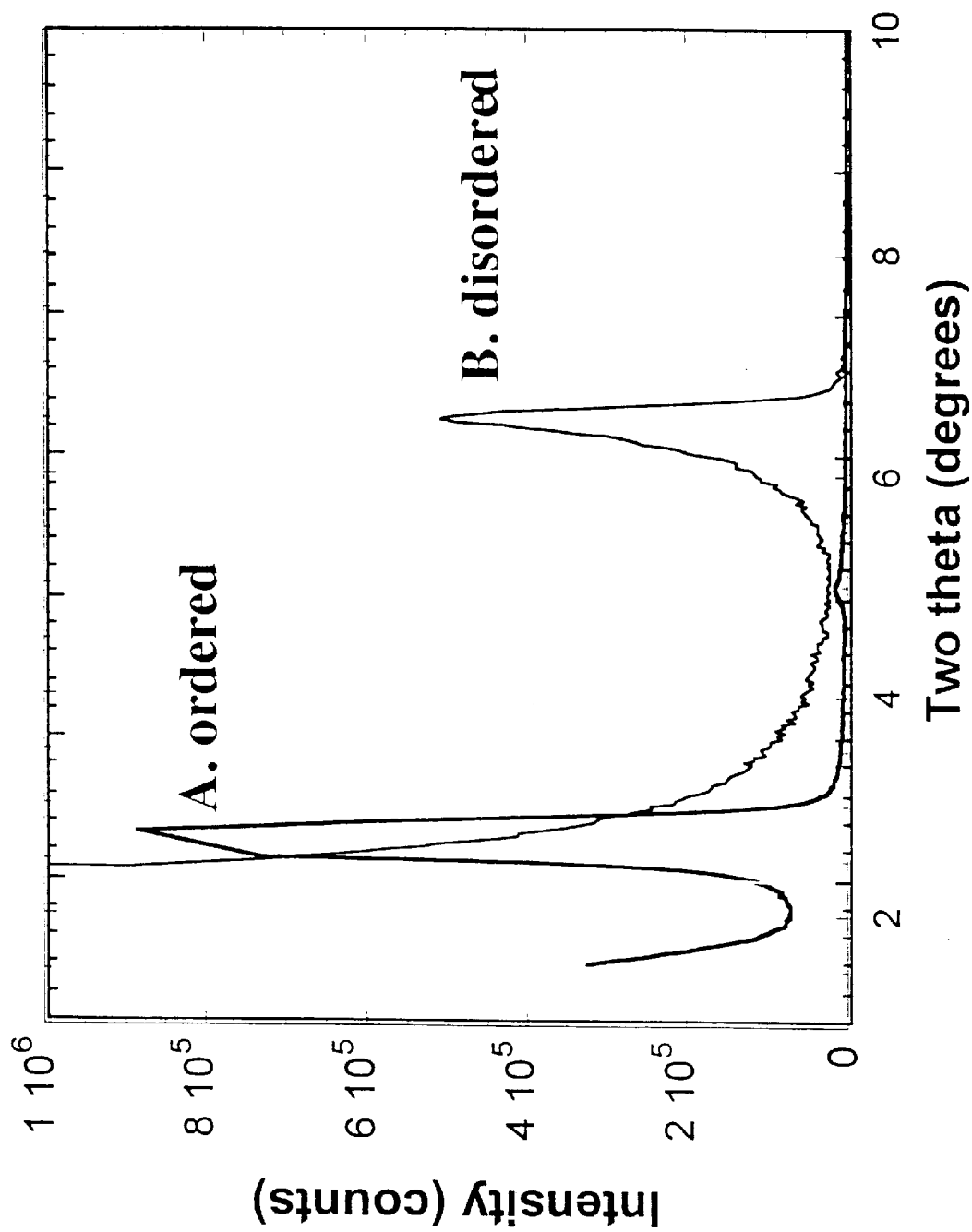
FIG. 3 shows x-ray diffraction patterns of disordered and ordered thin films.
Figure 4:
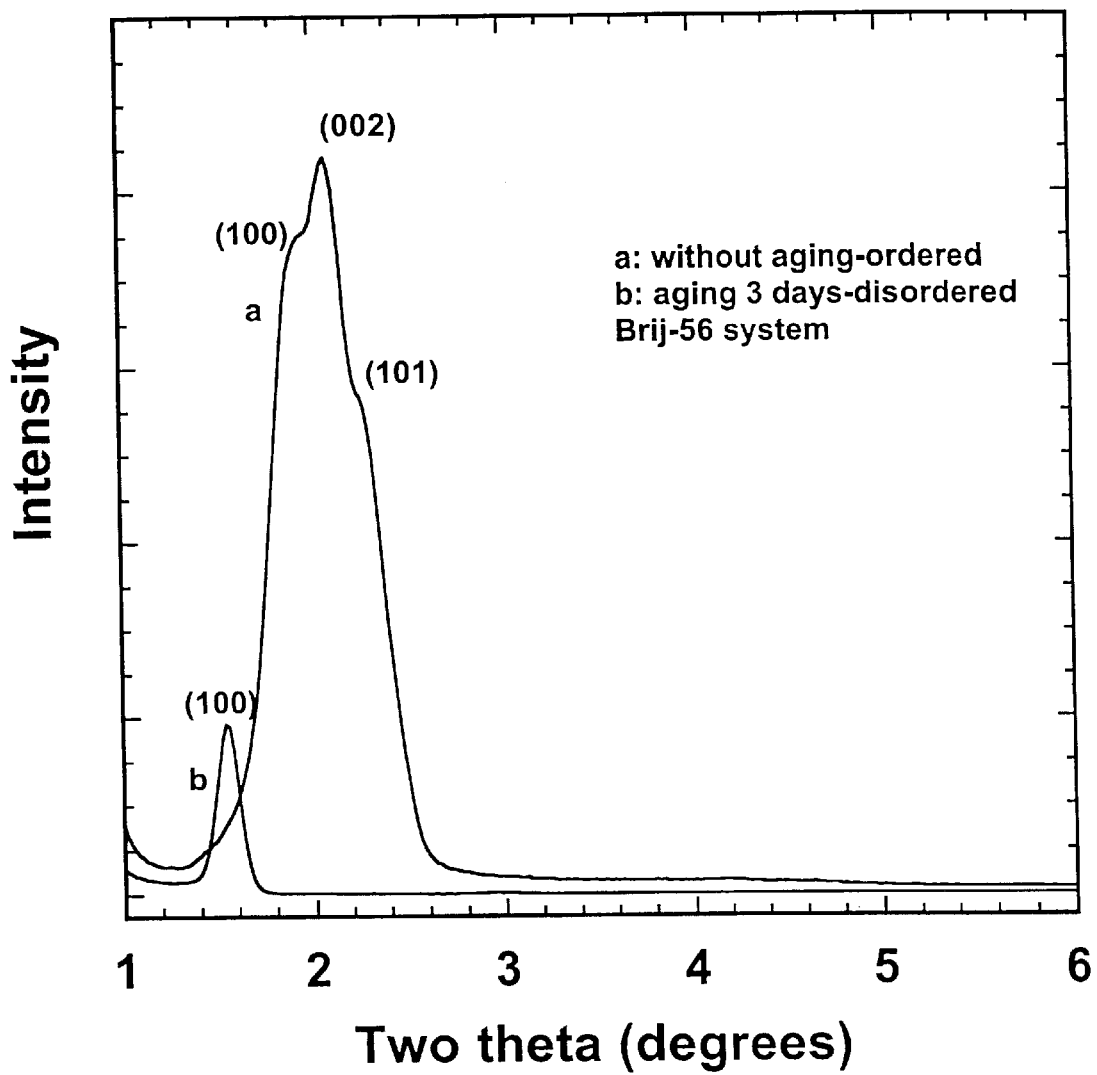
FIG. 4 shows x-ray diffraction patterns of disordered and ordered thin films.
Figure 5:
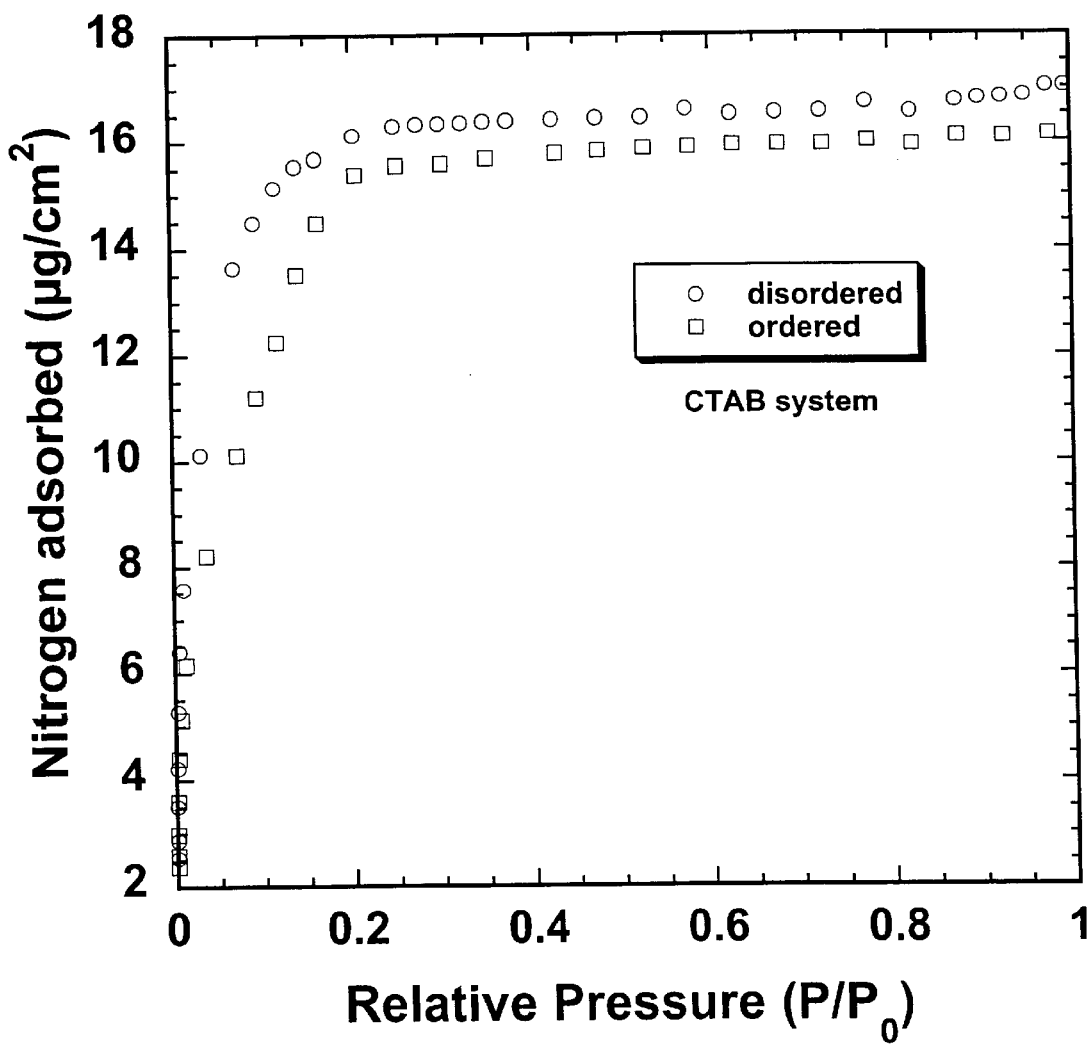
FIG. 5 shows nitrogen adsorption isotherms of disordered and ordered thin films.
Figure 6:
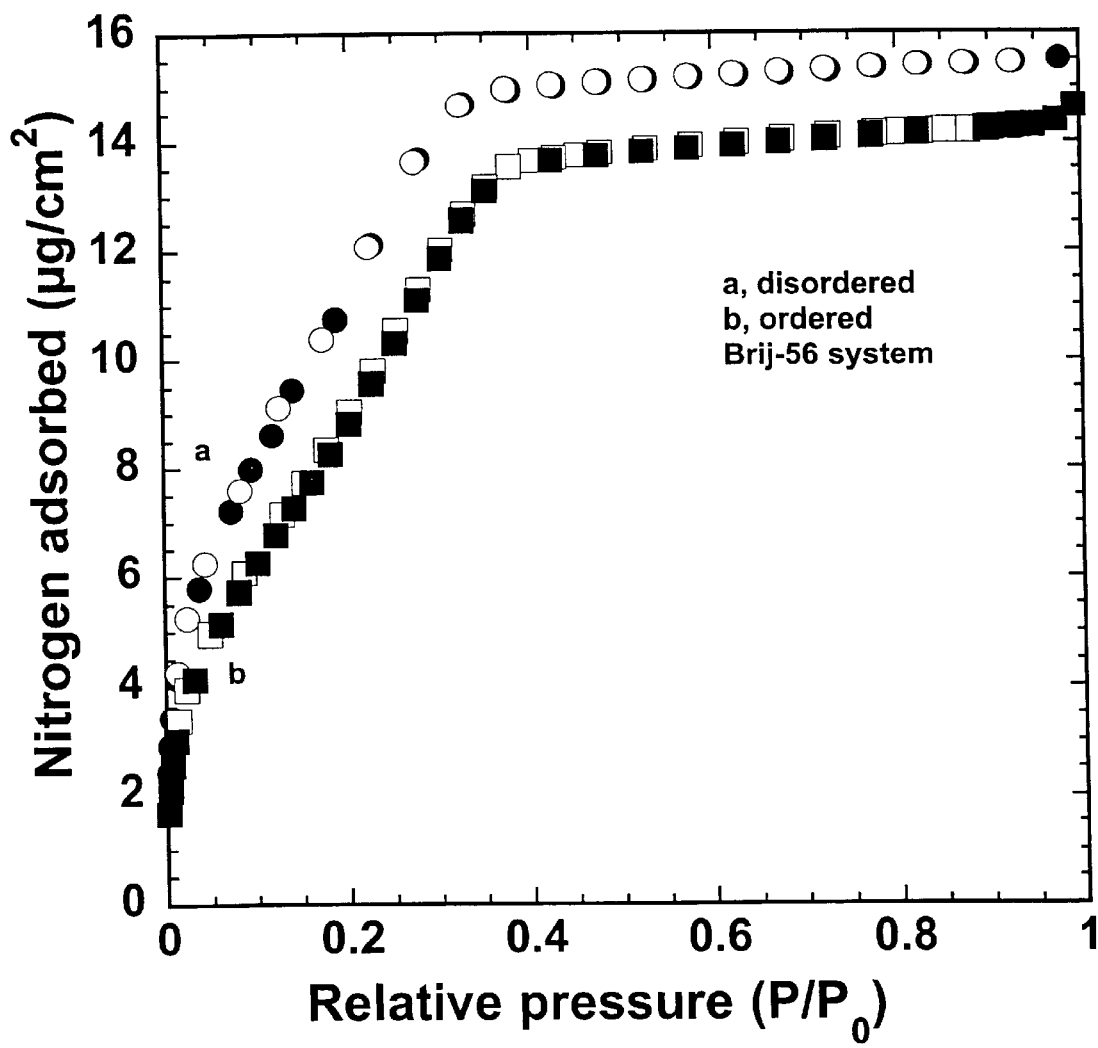
FIG. 6 shows nitrogen adsorption isotherms of disordered and ordered thin films.

Modifications of this preparation allow both ordered and disordered thin films to be prepared. Ordered films, more crystalline in characteristics, as determined by low angle x-ray diffraction, and disordered films, more amorphous in characteristics, are useful in different applications. As typical with the thin films prepared according to the present invention, both the ordered and disordered thin films have a relatively monodisperse pore size distribution. The ordered thin films have a two-dimensional regularity, as shown by transmission electron microscopy (TEM) images in FIG. 1 where a CTAB surfactant was used and in FIG. 2 where a polyoxyethylene ether of an aliphatic alcohol surfactant was used, as compared to the one-dimensional regularity of the disordered thin films. The corresponding x-ray diffraction patterns (XRDs) for the materials of FIGS. 1 and 2 are shown in FIGS. 3 and 4. As shown by the XRDs, the ordered thin films differ from the disordered thin films in that the XRDs of the ordered thin films have multiple peaks in the range $2\theta=0.5-10°$ while the XRDs of the disordered thin films have only one peak in the range $2\theta=0.5-7°$. Nitrogen isotherms of the ordered and disordered films of FIGS. 1 and 2 are shown in FIGS. 5 and 6, respectively, and show that the pores are relatively monodisperse from the steepness of the data. In addition, FIG. 6 shows there is very little hysteresis (adsorption vs desorption) that further indicates the monodispersity and regularity of the pore structure.

In one embodiment, an ordered hybrid film was prepared by first preparing the silica sol A2 and then adding a mixture of the TFTS and surfactant to the silica sol, with the surfactant concentration less than the critical micelle concentration. The acid concentration employed in the A2 synthesis procedure is adjusted to minimize the siloxane condensation rate, thereby promoting facile silica-surfactant self-assembly during the coating procedure. After solvent evaporation during coating of a substrate, the material organizes into an ordered liquid crystalline mesophase. In general, these ordered thin films have relatively narrow pore size distributions with two or more x-ray diffraction (XRD) peaks in the range $2\theta=0.5-10°$.

In another embodiment, a disordered hybrid film was prepared by mixing first TFTS, TEOS an alcohol, water and an acid. The mixture is more efficiently reacted at a slightly elevated temperature, for example approximately 60° C. under constant stirring. A surfactant, such as CTAB, is then added at a concentration less than the critical micelle concentration. The liquid is coated onto a substrate, allowing solvent evaporation, and a disordered thin film is formed. In general, these disordered thin films also have relatively narrow pore size distributions but with only one XRD peak, generally in the range $2\theta=0.5-7°$.

For both the ordered and disordered hybrid materials, thin films were prepared by coating the sols onto a substrate, such as a crystal silicon wafer or ST-cut piezoelectric crystalline quartz substrate.

In another embodiment, TEOS, ethanol, water, HCl and TFTS were mixed with a non-ionic solvent. A three-dimensional structure was obtained by utilizing a relatively high concentration of surfactant, as further described in Example 3. This embodiment shows the capability to tailor material characteristics by controlling the relative proportion of the reactants. With a reactant mole ratio of TEOS:ethanol:water:HCl:surfactant:TFTS of 1:22:5:0.004:0.092–0.31:0.039–0.1, a thin film was prepared with thickness less than 1 micron and a surface area of greater than 800 cm$^2$/cm$^2$ (film), a porosity greater than 50% and an average pore diameter of 25 Å.

Figure 7:
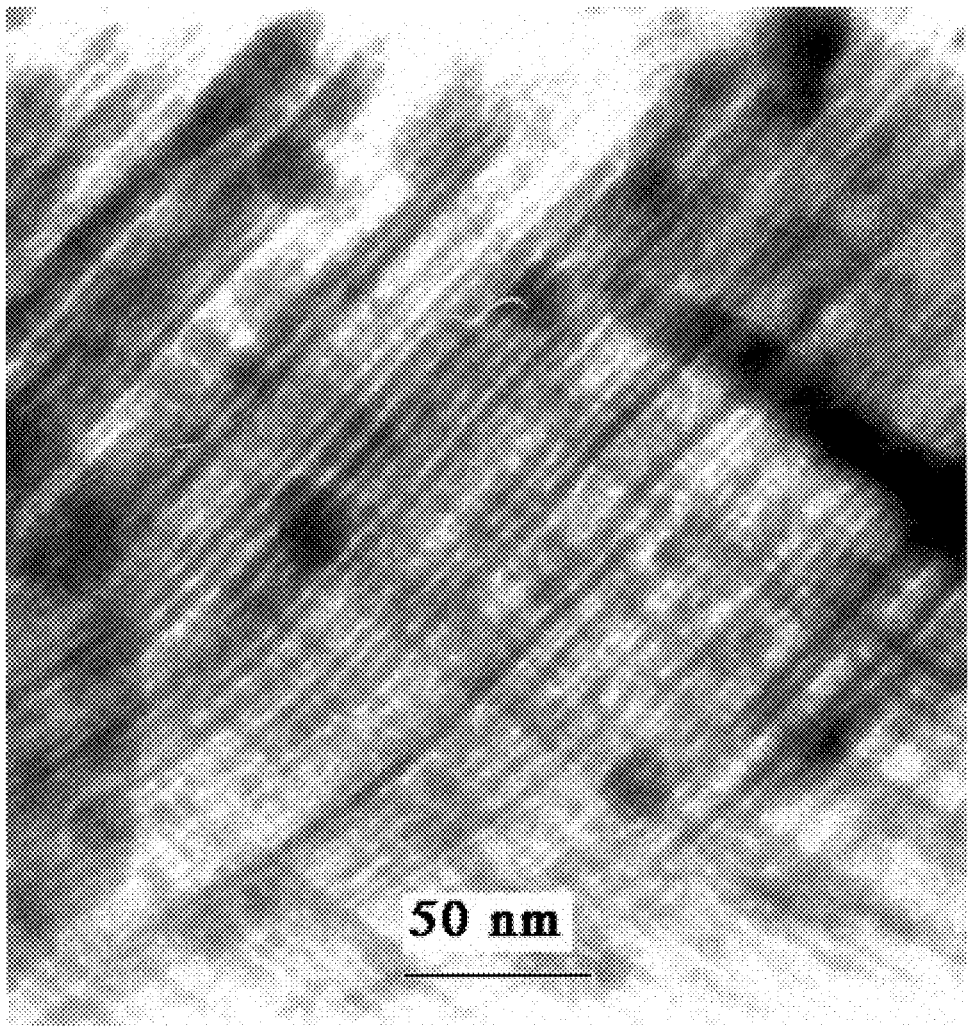
FIG. 7 shows TEM images of a thin film with silver nanowires.

In another embodiment, with the interstitial compound a mercaptopropyltrimethoxylsilane, a mercapto-derivatized mesoporous thin film was prepared that had a thickness less than 1 micron and surface area of greater than 1000 cm$^2$/cm$^2$ and an average pore diameter of 24 Å. After calcination and processing, as described further in Example 4, the thin film showed affinity for silver and silver nanowires were able to be grown within the mesoporous channels. FIG. 7 shows a TEM image of silver nanowires grown within a three-dimensional pore channel network.

In another embodiment, fluorescent dye molecule and proteins functioned as the interstitial compounds and were incorporated into the thin film structure, even though, interestingly, these compounds were larger than the characteristic spacing of the thin film mesophase. The formation of the thin film by the liquid-phase processing method of the present invention allows the mesophase structure to conform around the incorporated interstitial compounds. Subsequent tests confirmed that bio-activity was maintained when using the protein cytochrome c and films prepared with rhodamine B exhibit fluorescent spectra characteristic of rhodamine B.

A material potentially useful as a non-linear optical material was also prepared by using 3-(2,4-dinitrophenylamino) propyl(triethoxy)silane as the interstitial compound. Mesoporous silica films with magnetic properties were prepared by using iron- and copper-exchanged dodecylsulfate surfactants. The embodiments demonstrate the capability to use inorganic, organic, and bioactive composite materials in the formation of both ordered and disordered thin films.

In another embodiment, the interstitial compound can be a hydrophobic organic polymer, oligomer, or swelling agent that swells the liquid crystalline mesoporous material and thereby increases the porosity of the formed thin film. Materials prepared with hydrophobic organic polymers were prepared with a resulting dielectric constant less than 2, showing potential use for applications requiring low-dielectric constant materials.

EXAMPLES

Example 1

Hydrophobic Fluoroalkyl-Modified Thin Film Mesophases

Sols were prepared from tridecafluoro-1,1,2,2,-tetrahydrooctyltriethoxysilane (abbreviated as TFTS), tetraethylorthosilicate (abbreviated as TEOS, chemical formula Si(OC$_2$H$_5$)$_4$), and a surfactant, cetyltrimethylammonium bromide (abbreviated as CTAB, chemical formula CH$_3$(CH$_2$)$_{15}$N(CH$_3$)$_3$Br). Each TFTS molecule contains one non-hydrolyzable tridecafluoro-1,1,2,2,-tetrahydrooctyl ligand. Two synthesis procedures were employed resulting in either ordered hybrid films (OHF) or disordered hybrid films (DHF). OHF sols were prepared by addition of 3.6 mL TFTS to 36 mL of an acidic silica sol (A2) followed by dilution with two volumes of ethanol (EtOH) and addition of 3.2 g CTAB to 120 mL of the diluted sol. The acid concentration employed in the A2 synthesis procedure was chosen to minimize the siloxane condensation rate, thereby promoting facile silica-surfactant self-assembly during dip-coating. The DHF sol was prepared by reacting TFTS, TEOS, ethanol, H$_2$O, and HCl in a molar ratio of 0.15:0.85:3.8:5.1:5.3×10$^{-3}$ at 60° C. for 90 min under constant stirring, followed by aging at 50° C. for 3 days, dilution with two volumes of ethanol, and addition of 3.2 g CTAB to 120 mL of the diluted sol. For both sols, the final molar ratios TFTS:TEOS:EtOH:H$_2$O:CTAB were 0.15:0.85:21.8:5.1:5.3×10$^{-3}$. This initial CTAB concentration was chosen to be much less than the critical micelle concentration cmc as confirmed by dynamic light scattering.

Thin films were prepared by dip-coating the sols onto single crystal silicon wafers or ST-cut piezoelectric crystalline quartz surface acoustic wave (SAW) substrates. A rate of 50 cm/min in a nitrogen atmosphere is an efficient rate. Comparable bulk specimens (xerogels) were prepared by casting the sols in petri-dishes followed by rapid drying under ambient conditions. To promote siloxane condensation, the film and xerogel specimens were exposed to $NH_3$ vapor by suspending the samples above an aqueous solution of 6N $NH_4OH$ for about 30 min. Samples were heated at 1° C./min to 260° C. for 5 hr in a $N_2$ atmosphere to decompose the CTAB and outgassed at 250° C. for 24 hr (<1 mmHg) to remove any residual decomposition products. X-ray diffraction (XRD) (Siemens Model D500) combined with high resolution transmission electron microscopy (HRTEM) (JEOL 2010, operating voltage 200 KV) were used to characterize the hybrid film mesostructures. Thermal gravimetric analysis (TGA) and differential thermal analysis (DTA) (STA 1500, PL Thermal Sciences) were used to characterize the pyrolysis process. Infrared (IR) spectroscopy (Nicolet model 800) was used to confirm the selective removal of CTAB (KBr powder pellet technique). The thickness of the coated films was measured using ellipsometry (Gaertner Scientific Corporation, Model L116C) assuming that the absorption coefficient is zero at $\lambda=632.8$ nm. Film thickness values were confirmed by scanning electron microscopy (SEM) of film cross-sections.

The films deposited on the SAW substrates were used to estimate surface area, pore size, and total pore volume. The amount of nitrogen adsorbed as a function of relative pressure was determined from the frequency change, assuming that the SAW frequency is only perturbed by a mass loading variation. Nitrogen adsorption isotherms at 77 K were obtained by plotting the amount of nitrogen adsorbed versus the corresponding relative pressure of nitrogen. Surface areas were estimated by using the Brunauer-Emmet-Teller (BET) equation; pore radii (r) were estimated by modeling the pores as cylinders: the hydraulic radius $r=2V/S$, where V is the pore volume and S is the surface area.

TGA/DTA curves of the TFTS/TEOS hybrid xerogel obtained in a nitrogen atmosphere using a heating rate of 4° C./min showed weight loss (approximately 40%), accompanied by endothermic peaks at 170° C. and 230° C. This first weight loss is due to the decomposition of CTAB in nitrogen (the melting and decomposition temperatures of CTAB are about 230° C.). This weight loss corresponds to that of CTAB added in the hybrid xerogel (approximately 40%). The second step of weight loss (approximately 27%) accompanied by an exothermic peak at 520° C. corresponds to the decomposition of tridecafluoro-1, 1,2,2,-tetrahydrooctyl ligands; the measured weight loss is consistent with that of the tridecafluoro-1,1,2,2,-tetrahydrooctyl ligands added (approximately 28%). No significant weight loss or thermal events are observed between 300° C. and 450° C., thus, the CTAB-containing hybrid materials can be heated to 260° C. in a nitrogen atmosphere to selectively remove the CTAB but not the fluorinated organic ligands. Infrared spectra confirm that CTAB can be selectively removed by pyrolysis without affecting tridecafluoro-1,1,2, 2,-tetrahydrocotyl ligands in the hybrid materials.

FIG. 5 shows the nitrogen adsorption isotherms (at 77 K) of the porous hybrid films obtained using the SAW measurement. It shows typical isotherms of surfactant-templated mesoporous silica with a uni-modal pore size distribution. The lack of hysteresis and absence of any appreciable adsorption at relative pressures above 0.3 is consistent with a uni-modal porosity with no interparticle meso- or macroporosity. The thickness of the thin film was determined to be approximately 5000 Å, with an average pore size of approximately 16 Å, a porosity of approximately 41% and a surface area of approximately 512 $cm^2/cm^2$. Because the surface area of the surfactant-templated thin film can be as high as 512 $cm^2/cm^2$, it is ideal for highly sensitive sensor applications. The pore structure was observed using high-resolution transition electron microscopy (HRTEM). The pore structure of the disordered TFTS/TEOS hybrid film prepared by pre-reacting TFTS with TEOS shows a random three-dimensional pore network having 15–18 Å pore sizes with a uni-modal pore size distribution, consistent with the results of the SAW measurement. The pore structure of the ordered TFTS/TEOS hybrid film prepared by post-reacting TFTS with A2** sols shows that the post-reacting procedure leads to the formation of thin films with an ordered hexagonal mesophase. X-ray diffraction (XRD) shows a one-dimensional hexagonal mesophase with a d-spacing of 36 Å consistent with TEM results.

Capacitance versus voltage measurements performed on the calcined films and calcined films post reacted with hexamethyldisiloxane indicated dielectric constant values ranging from 2.4 to 1.8.

Example 2

Effect of Organosilane on Mesostructure

Silica sols were prepared by a two-step process in the first step: TEOS ($Si(OC_2H_5)_4$, ethanol, water, HCl were refluxed at 60° C. in the following molar ratio: $1:3.8:1.5\times10^{-5}$. the sol was cooled to room temperature, additional water was added, and HCl concentration was increased to approximately 0.01 M. Following stirring for 15 minutes at 25° C., the sols were diluted with 2 equivalents ethanol. A non-ionic surfactant (a polyoxyethylene ether) was added. At this stage, the reactant mole ratios $TEOS:EtOH:H_2O:HCl$: surfactant were 1:22:5:0.004:0.093–0.31. Hexadecyltrimethoxysilane was added followed by surfactants. The final reactant molar ratios were: 1 TEOS:22 $C_2H_5OH$:5 $H_2O$:0.093–0.31 surfactant: 0.039–0.1 organosilane.

Films were deposited on silicon wafers by dip-coating at a speed of 7.6–51 cm/min or by spin-coating at 2000–8000 rpm. Films were pyrolyzed in air at 400° C. or in nitrogen at 350° C. for three hours, using heating and cooling rates of 1° C./min.

Example 3

Formation of a 3-dimensional Hexagonal Hydrophobic Film

Silica sols were prepared by a two-step process. In the first step: TEOS ($Si(OC_2H_5)_4$, ethanol, water, HCl were refluxed at 60° C. in the following molar ratio: $1:3.8:1.5\times10^{-5}$. The sol was cooled to room temperature. Additional water was added, and the HCl concentration was increased to approximately 0.01 M. Following stirring for 15 minutes at 25° C., the sols were diluted with 2 equivalents ethanol. A 4 wt % non-ionic surfactant (a polyoxyethylene ether) was added. At this stage, the reactant mole ratios TEOS: EtOH: $H_2O$: HCl: surfactant were 1:22:5:0.004:0.093–0.31. 0.50 g of tridecafluoro-1,1,2,2-tetrahydrooctyl)triethoxylsilane (TFTS) was added followed by surfactants. The final reactant molar ratios were: 1 TEOS:22 $C_2H_5OH$:5 $H_2O$:0.093–0.31 surfactant: 0.039–0.1 organosilane.

Films were deposited on silicon wafers by dip-coating at a speed of 7.6–51 cm/min or by spin-coating at 2000–8000 rpm. Films were pyrolyzed in air at 400° C. or in nitrogen at 350° C. for three hours, using heating and cooling rates of 1° C./min.

FIG. 4 shows an XRD pattern of a calcined film. It is consistent with a 3-d hexagonal mesophase with unit cell constants c=78 Å, a=46.2 Å. TEM studies showed that the calcined film exhibits a completely uniform 3-dimensional mesophase throughout the film thickness. FIG. 4 shows both the XRD of the ordered film and the XRD of the disordered thin films after aging 3 days.

FIG. 6 shows the corresponding SAW-based $N_2$ sorption isotherms of the calcined film s(adsorption, filled, and desorption, open). The film was applied to an approximately 1 $cm^2$ area of a piezoelectric ST-cut quartz substrate with interdigital gold transducers designed to operate at 97 MHz. Mass change was monitored (approximately 80 $pg/cm^2$ sensitivity) as a function of relative pressure using a surface acoustic wave (SAW) technique. Mass change was converted to volume change (STP) assuming a $N_2$ density of $1.55 \times 10^{-3}$ $g/cm^3$. The film mass was calculated from the film thickness and volume fraction porosity (derived from ellipsometric analyses), assuming a framework density of 2.1 $g/cm^3$. The isotherm was acquired directly from a supported film without detachment from the substrate. The lack of hysteresis and absence of any appreciable adsorption at relative pressures above 0.3 is consistent with a uni-modal pore size distribution with no interparticle meso- or macroporosity. The surface area calculated assuming a framework density of 2.1 $g/cm^3$ is 850 $m^2/g$, the pore diameter is 25 Å, and the fraction porosity is 54%.

Example 4

Mercapto-derivatized Mesoporous Thin Films and Silver/silica Composite Films

Silica sols were prepared by a two-step process. In the first step: TEOS ($Si(OC_2H_5)_4$, ethanol, water, HCl were refluxed at 60° C. in the following molar ratio: $1:3.8:1.5 \times 10^{-5}$. The sol was cooled to room temperature. Additional water was added, and the HCl concentration was increased to approximately 0.01 M. Following stirring for 15 minutes at 25° C., the sols were diluted with 2 equivalents ethanol. A 4 wt % non-ionic surfactant (a polyoxyethylene ether) was added. At this stage, the reactant mole ratios TEOS:EtOH:$H_2O$:HCl: surfactant were 1:22:5:0.004:0.093–0.31. 0.5 g of mercaptopropyltrimethoxylsilane, $HS(CH_2)_3Si(OCH_3)_3$ was added followed by surfactants. The final reactant molar ratios were: 1 TEOS:22 $C_2H_5OH$:5 $H_2O$:0.093–0.31 surfactant: 0.039–0.1 organosilane.

Films were deposited on silicon wafers by dip-coating at a speed of 7.6–51 cm/min or by spin-coating at 2000–8000 rpm. Films were pyrolyzed in air at 400° C. or in nitrogen at 350° C. for three hours, using heating and cooling rates of 1° C./min.

Based on the nitrogen isotherm data, the material has a uni-modal pore distribution centered at 24 Å. The BET surface area is 1060 $m^2/g$.

After calcination, the film was immersed into 1 M silver nitrate aqueous solution for 2 hours. The film was washed with DI water and put it into a 0.1 M $NaBH_4$ aqueous solution or annealed in $H_2$ at 400° C. to reduce the silver nitrate. At this stage, silver nanoparticles were formed. Immersion into 1 M silver nitrate aqueous solution followed by reduction in 0.1 M $NaBH_4$ aqueous solution or by annealing in $H_2$ was repeated twice to create silver nanowires. The TEM micrograph of the corresponding film shows silver nanowires growing within the mesopore channels. The BET surface area is 730 $m^2/g$ and the average pore size is 18 Å.

Example 5

Encapsulation of Fluorescent Dye Molecules and Proteins in Mesoporous Films

Silica sols were prepared by a two-step process. In the first step: TEOS ($Si(OC_2H_5)_4$, ethanol, water, HCl were refluxed at 60° C. in the following molar ratio: $1:3.8:1.5 \times 10^{-5}$. The sol was cooled to room temperature. Additional water was added, and the HCl concentration was increased to approximately 0.01 M. Following stirring for 15 minutes at 25° C., the sols were diluted with 2 equivalents ethanol. A 4 wt % non-ionic surfactant (a polyoxyethylene ether) was added along with 0.1 g rhodamine B. Other organic substituents such as organic dye molecules or proteins can be utilized. At this stage, the reactant mole ratios TEOS:EtOH:$H_2O$:HCl:surfactant were 1:22:5:0.004:0.093–0.31.

Films were deposited on silicon wafers by dip-coating at a speed of 7.6–51 cm/min or by spin-coating at 2000–8000 rpm. Films were pyrolyzed in air at 400° C. or in nitrogen at 350° C. for three hours, using heating and cooling rates of 1° C./min. Optical micrography of fluorescence emission from a patterned, mesostructured silica film containing rhodamine B confirm that the rhodamine remains optically active in the mesostructured film.

Another silica sol was prepared as above with 2 wt % CTAB, 2 wt % non-ionic surfactant (a polyoxyethylene ether) and 0.02 g cytochrome c. Shifts in the UV-visible absorption spectrum with pH indicate conformation changes of cytochrome c with pH. This confirms that bio-activity is maintained in the guest bio-active species. TEM shows that these films have ordered mesostructures.

Example 6

Optoelectronic Films

Silica sols were prepared by a two-step process. In the first step: TEOS ($Si(OC_2H_5)_4$, ethanol, water, HCl were refluxed at 60° C. in the following molar ratio: $1:3.8:1.5 \times 10^{-5}$. The sol was cooled to room temperature. Additional water was added, and the HCl concentration was increased to approximately 0.01 M. Following stirring for 15 minutes at 25° C., the sols were diluted with 2 equivalents of ethanol. A 4 wt % non-ionic surfactant (a polyoxyethylene ether) was added. At this stage, the reactant mole ratios TEOS:EtOH:$H_2O$:HCl: surfactant were 1:22:5:0.004:0.093–0.31. 0.5 g 3-(2,4-dinitrophenylamino)propyl(triethoxy)silane (DNPTES) was added followed by surfactants. The final reactant molar ratios were: 1 TEOS:22 $C_2H_5OH$:5 $H_2O$:0.093–0.31 surfactant: 0.039–0.1 DNPTES.

Films were deposited on silicon wafers by dip-coating at a speed of 7.6–51 cm/min or by spin-coating at 2000–8000 rpm. Films were pyrolyzed in air at 400° C. or in nitrogen at 350° C. for three hours, using heating and cooling rates of 1° C./min. The TEM image of this material shows that the structure is consistent with a 3-dimensional hexagonal thin film mesophase. The DNPTES-derivatized film is of interest as a $\chi^2$ non-linear optical material.

Example 7

Mesoporous Silica Films with Magnetic Properties

Silica sols were prepared by a two-step process. In the first step: TEOS ($Si(OC_2H_5)_4$, ethanol, water, HCl were refluxed at 60° C. in the following molar ratio: 1:3.8:1.5× $10^{-5}$. The sol was cooled to room temperature. Additional water was added, and the HCl concentration was increased to approximately 0.01 M. Following stirring for 15 minutes at 25° C., the sols were diluted with 2 equivalents ethanol. In one preparation, an iron-exchanged dodecylsulfate surfactant, $Fe(DS)_2$, was added. In a second preparation, a copper-exchanged dodecylsulfate surfactant, $Cu(DS)_2$, was added. These two surfactants were prepared according to Moroi et al. (Moroi, T., Motomura, K., Matuura, J., Colloid Interface Sci. 1974, 46, 111, incorporated by reference herein). An aqueous solution of 0.2 M sodium dodecylsulfate (SDS) was mixed with 0.3 M of either ferrous or copper chloride. The solution was kept at 2° C., and a precipitate appeared. The precipitate was washed several times with a 0.1 M iron or copper chloride solution and recrystallized in distilled water and vacuum dried. The reactant mole ratios $TEOS:EtOH:H_2O:HCl:surfactant$ were 1:22:5:0.004:0.093–0.31.

Films were deposited on silicon wafers by dip-coating at a speed of 7.6–51 cm/min or by spin-coating at 2000–8000 rpm. Films were coated on silicon wafers and calcined in air at 400° C. for 3 hours or in hydrogen at 400° C. for 3 hours. The resulting materials have certain magnetic properties.

The invention being thus described, it will be apparent that the same may be varied in many ways. Such variations are not to be regarded as a departure from the spirit and scope of the invention, and all such modifications as would be obvious to one skilled in the art are intended to be included within the scope of the following claims.

We claim:

1. An evaporation-induced self-assembly method to prepare a liquid, crystalline film mesophase material, comprising:

mixing a precursor sol, a solvent, a surfactant, and an interstitial compound to prepare a silica sol, wherein said surfactant is at a concentration less than the critical micelle concentration; and evaporating a portion of the solvent from said silica sol to form a liquid, crystalline, film mesophase material.

2. The method of claim 1 further comprising the step of heating said liquid, crystalline, film mesophase material to form a surfactant-templated film.

3. The method of claim 2 wherein the step of heating removes a portion of said surfactant.

4. The method of claim 3 wherein the surfactant-templated film has pores of diameter of approximately less than 200 Å.

5. The method of claim 3 wherein the surfactant-templated film has a surface area greater than approximately 100 $cm^2/cm^2$ film surface.

6. The method of claim 1 wherein the interstitial compound is physically entrapped within said liquid, crystalline, thin film mesophase material.

7. The method of claim 1 wherein the precursor sol is selected from the group consisting of tetraethylorthosilicate, tetraethylorthosilicate, titanium butoxide, titanium iso-propoxide, zirconium n-butoxide, aluminum iso-propoxide, and aluminum iso-propoxide.

8. The method of claim 1 wherein the interstitial compound is selected from the group consisting of organoalkoxysilanes, proteins, dyes, and metal-containing compounds.

9. The method of claim 8 wherein the interstitial compound is selected from the group consisting of tridecafluoro-1,1,2,2,-tetrahydrooctyltriethoxysilane, mercaptopropyltrimethoxylsilane, rhodamine B, cytochrome c, and 3-(2,4-dinitrophenylamino)propyl(triethoxy) silane.

10. The method of claim 2 wherein the surfactant-templated film is an ordered material with at least two x-ray diffraction peaks in the range 2θ=0.5–10°.

11. The method of claim 2 wherein the surfactant-templated film is a disordered material with one x-ray diffraction peak in the range 2θ=0.5–7°.

12. The method of claim 2 wherein the surfactant-templated film is exposed to ammonia vapor to promote condensation.

13. The method of claim 1 wherein the surfactant is selected from the group consisting of sulfates, sulfonates, phosphates, carboxylic acids, alkylammonium salts, gemini surfactants, cetylethylpiperidinium salts, dialkyldimethylammonium, primary amines, poly (oxyethylene) oxides, octaethylene glycol monodecyl ether, octaethylene glycol monohexadecyl ether and block copolymers.

14. The method of claim 1 wherein the solvent is selected from the group consisting of an alcohol, formamide, and tetrahydrofuran.

15. The method of claim 1 wherein the step of evaporating a portion of the solvent is performed by a method selected from the group consisting of spin-coating, spray-coating, dip-coating, and aerosol processing.

16. The method of claim 15 wherein the silica sol is coated onto a substrate by a method selected from the group consisting of spin-coating, spray-coating, and dip-coating.

17. The method of claim 16 wherein said substrate is selected from the group consisting of a crystal silicon wafer and a piezoelectric crystalline quartz substrate.

18. The method of claim 1 wherein the interstitial compound is selected from the group consisting of a hydrophobic molecule, an oligomer, and a polymer.

19. An evaporation-induced self-assembly method to prepare a porous, surfactant-templated film, comprising:

mixing tetraethylorthosilicate, alcohol, water, an acid, a surfactant, and tridecafluoro-1,1,2,2-tetrahydrooctyltriethoxysilane, wherein said surfactant is at a concentration less than the critical micelle concentration, to form a homogeneous mixture;

coating a substrate with said homogeneous mixture, said coating inducing evaporation of a portion of the solvent to produce a liquid, crystalline film mesophase material; and heating said liquid, crystalline film mesophase material to decompose said surfactant, forming a porous, surfactant-templated film.

20. The method of claim 19 wherein the surfactant is cetyltrimethylammonium bromide.

21. The method of claim 20 wherein the molar ratios of tridecafluoro-1,1,2,2-tetrahydrooctyltriethoxysilane:tetraethylorthosilicate:alcohol:water: cetyltrimethylammonium bromide are 0.15:0.85:21.8:5.1:0.0053.

* * * * *